(12) United States Patent
Bell et al.

(10) Patent No.: US 6,450,597 B1
(45) Date of Patent: Sep. 17, 2002

(54) WEDGE SYSTEM SHELF ENCLOSURE FOR NETWORK DATA STORAGE SYSTEM

(75) Inventors: Michael Stephen Bell, Penrose; Grant Edward Carlson, Florissant, both of CO (US)

(73) Assignee: Eurologic Systems, Dublin (IR)

( * ) Notice: Subject to any disclaimer, the term of this patent is extended or adjusted under 35 U.S.C. 154(b) by 0 days.

(21) Appl. No.: 09/651,044

(22) Filed: Aug. 30, 2000

Related U.S. Application Data

(60) Provisional application No. 60/192,249, filed on Mar. 25, 2000.

(51) Int. Cl.$^7$ .............................................. A47B 88/00
(52) U.S. Cl. ................................ 312/223.1; 211/41.12; 361/732
(58) Field of Search ........................... 312/223.1, 223.2, 312/257.1; 211/41.12, 41.17, 26; 361/716, 732

(56) References Cited

U.S. PATENT DOCUMENTS

| | | | | |
|---|---|---|---|---|
| 5,130,887 A | * | 7/1992 | Trelford | 211/41.17 |
| 5,404,275 A | * | 4/1995 | Zenitani et al. | 361/802 |
| 5,564,804 A | * | 10/1996 | Gonzalea et al. | 312/223.2 |
| 6,067,225 A | * | 5/2000 | Reznikov et al. | 312/223.2 |
| 6,272,016 B1 | * | 8/2001 | Matonis et al. | 361/716 |

* cited by examiner

Primary Examiner—Peter M. Cuomo
Assistant Examiner—Jerry A. Anderson
(74) Attorney, Agent, or Firm—Oppedahl & Larson LLP

(57) ABSTRACT

A shelf enclosure for a network data storage system employs drive carriers having wedge mechanical interfaces with respective features on the enclosure, locking into place at the top and bottom of the carriers.

6 Claims, 9 Drawing Sheets

WEDGE SYSTEM SHELF ENCLOSURE FOR NETWORK DATA STORAGE SYSTEM

This patent application claims priority from U.S. appl. No. 60/192,249, filed Mar. 25, 2000, entitled "Shelf Enclosure for a Network Data Storage System", U.S. appl. No. 60/213,413, entitled "Integrating the Peripheral Interfaces of a Disk Drive-Based, data Storage Enclosure Into a Die Cast Magnesium Part", U.S. appl. No. 60/213,411, entitled "Incorporating an Interlock System Between a Data Storage Enclosure and Its Mating Disk Drive Carriers", and U.S. appl. No. 60/220,124, entitled "Carrier To Shelf Interface", which applications are hereby incorporated herein by reference to the extent permitted by law.

The invention relates generally to network data storage systems, and relates particularly to enclosures or housings for data storage units which form part of a network data storage system.

BACKGROUND

With the explosive growth of the Internet and with the growth of client-server systems in both business-to-business and business-to-consumer relationships, there has come to be a profound shift in business and consumer expectations regarding availability and reliability of servers and associated data. Historically many systems were batch-oriented, while nowadays systems are updated in real time. Historically many systems provided information to a small number of people who in turn interfaced with large numbers of people; nowadays customers and users expect to be able to obtain information themselves without having to speak to an intermediary. Historically, in batch-oriented systems, it was a straightforward matter to protect against single-point data loss by simply replicating files before or after the batch processing. In present-day systems where continual updating takes place, no single act of replication provides a complete solution to the problem of backups.

A number of approaches have been devised to deal with such needs. One approach, and historically the first approach, was to attempt to make an arbitrarily reliable disk drive or other storage mechanism. Such an approach is uneconomic, however, and even if cost were of no concern, there are natural upper limits on how reliable a particular storage device can be.

A different approach, called RAID (redundant array of independent disks) has proven to be a much better way to attempt to achieve high reliability in data storage. A RAID system will contain as many as about fourteen disk drives, tied together logically. Versions of RAID have been developed which store each item of data several times on each of several different physical drives. In this way, loss of a single physical drive need not result in loss of any data. Indeed, with appropriate software and system design, it is possible to protect against loss of two drives. Still other versions of RAID permit improved data latency, that is, a reduction in the interval between the time that an item of data is desired and the time that the item of data is retrieved.

Stated differently, RAID permits the use of several relatively inexpensive disk drives of non-perfect reliability, in a system which can be shown to be extremely reliable.

The above-mentioned advantages are found regardless of whether particular physical drives are permanently installed or are removable. But with further advances in hardware and software design, it has become possible for drives to be "hot-swappable", meaning that a drive or other system component can be removed while the system is operating, and replaced with a new unit. Under software control, the RAID system can offer seamless service while such swaps are taking place.

Given the many advantages of RAID systems, it is unsurprising that RAID systems have come into commercial use. In recent times the popularity of RAID systems has given rise to a great need for RAID systems of ever-greater capacity and storage density. There are competitive pressures to reduce the cost of RAID systems. Now that the logical function of a RAID system is well defined, attention has shifted to improving the enclosures and other infrastructure for the physical disk drives making up a RAID system.

Most RAID systems are rack-mounted, for example on industry-standard nineteen-inch racks. Each system is thus of a width to fit in the rack, and is of a height to accommodate the height of a disk drive. A plurality of disk drives are mounted in the system, parallel to each other and stacked to reach nearly the width of the rack.

Historical RAID enclosures are typically made of formed sheet metal. Such enclosures don't always keep their shape well, and some such enclosures can transmit vibration from one disk drive to another, leading to sympathetic vibrations and disk failure. It is important to keep the drives and power supplies from overheating, so cooling is important. Such cooling can be accomplished by a combination of forced-air cooling and other means such as conduction. The bulk material of a sheet-metal enclosure often contributes little to cooling, and in fact may impede cooling.

Formed sheet metal parts give rise to mechanical tolerances which stack up as the parts are assembled. Excessive tolerances can lead to assembled products which are unacceptable to customers for a number of reasons.

It is necessary to provide guideways which permit sliding disk drives into the enclosure. The guideways must satisfy many requirements, for example, they must cause the disk drive's connectors to align with corresponding connectors on a backplane inside the enclosure. The guideways must also be spaced and shaped to within particular tolerances simply to receive the disk drives. The guideways must provide locking mechanisms to lock disk drives into place, yet must permit a drive to be readily unlocked for removal.

It is also necessary to provide plenums or other air guides so that cooling air from cooling fans can pass over each of the disk drives. It would be unacceptable for any disk drive to be starved of cooling air. Yet a sheet-metal enclosure is relatively expensive to fabricate, especially considering the very demanding requirements for guideways and air plenums. Traditional enclosures are heavy. This adds to shipping costs.

In many enclosures the drive carriers essentially rest on the bottom shelf of the enclosure, leading to biased loading of the bottom shelf wall of the enclosure. Statically, this can lead to a deflection of the bottom shelf wall, causing the enclosure to exceed the permitted envelope for the case, for example to exceed a three-unit rack space by extending downward into the next rack space below. Such deflection also risks loss of the integrity of EMI shielding between the tops of the carriers and the top wall of the enclosure. In an earthquake scenario, deflection could give rise to slapping between adjacent enclosures possibly causing damage to hard drives or modules.

If drive carrier vertical motion is not fully constrained, there is the risk that drive rotational vibration could be coupled back into the enclosure. Such vibration coupling could lead to soft errors. If operating shock or vibration are present, lack of vertical constrain could produce soft drive errors or could even lead to intermittent or consistent disconnects at the electrical connector that joins the drive and the mother board.

Some prior art designs have employed large deflection spring fingers to attempt to vertically constrain the carriers in the enclosure, but this is not wholly satisfactory.

There is thus a great need for an enclosure for a disk storage system that keeps its shape well, that provides guideways for disk drives, that allows for easy provision of air plenums, that helps rather than hinders cooling, that doesn't weigh as much, and that can be economically manufactured.

SUMMARY OF THE INVENTION

A shelf enclosure for a network data storage system employs drive carriers having wedge mechanical interfaces with respective features on the enclosure, locking into place at the top and bottom of the carriers.

DESCRIPTION OF THE DRAWINGS

The invention will be described with respect to a drawing in several figures, of which.

Where possible, like reference designations have been used for like elements in the figures.

DETAILED DESCRIPTION OF EXEMPLARY EMBODIMENTS

Figure 1:
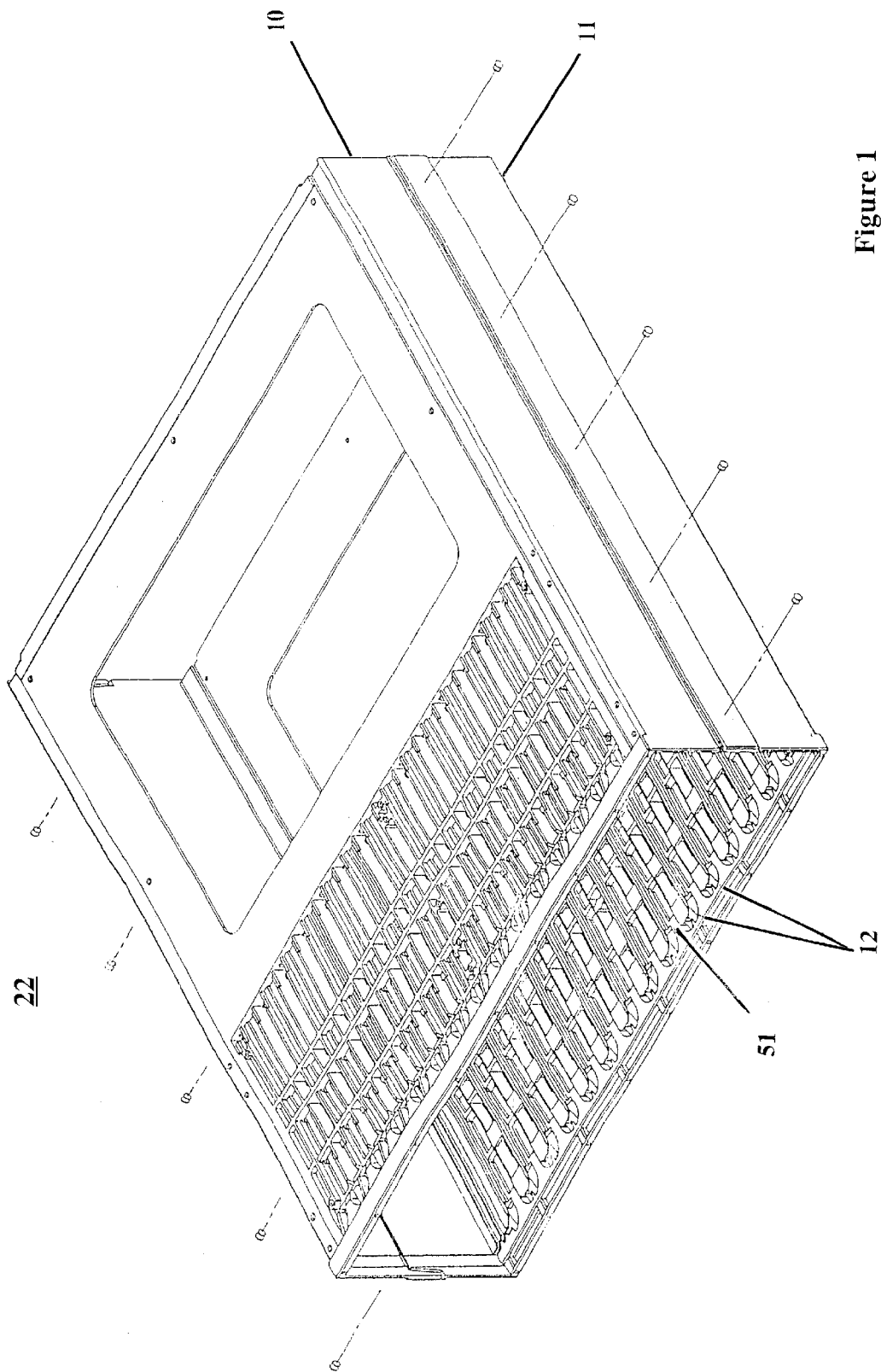
FIG. 1 is a perspective view of an enclosure according to the invention.

FIG. 1 is a perspective view of an enclosure 22 according to the invention. Top and bottom pieces 10 and 11 are shown. Importantly, the top and bottom pieces are identical. This reduces tooling costs. Rails 12 may be seen, integrally formed with the top and bottom pieces, and each pair of adjacent rails 12 defines a guideway 51. The enclosure 22 is preferably made of magnesium and is preferably made from AZ91D alloy.

Figure 2:
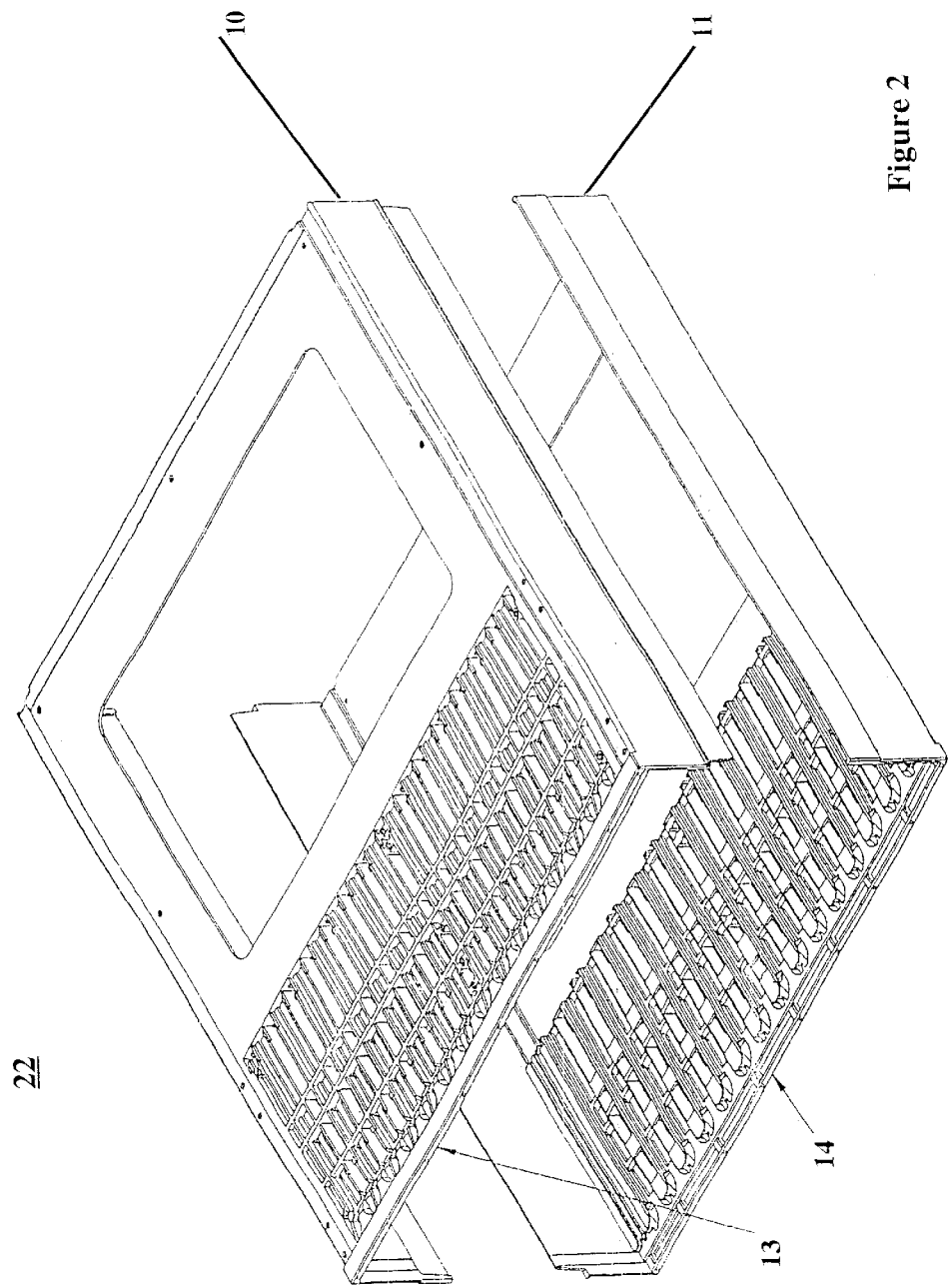
FIG. 2 is an exploded perspective view of the enclosure of FIG. 1.

FIG. 2 is an exploded perspective view of the enclosure 22 of FIG. 1. Top and bottom pieces 10 and 11 may be seen, having front edges 13 and 14 respectively.

Figure 3:
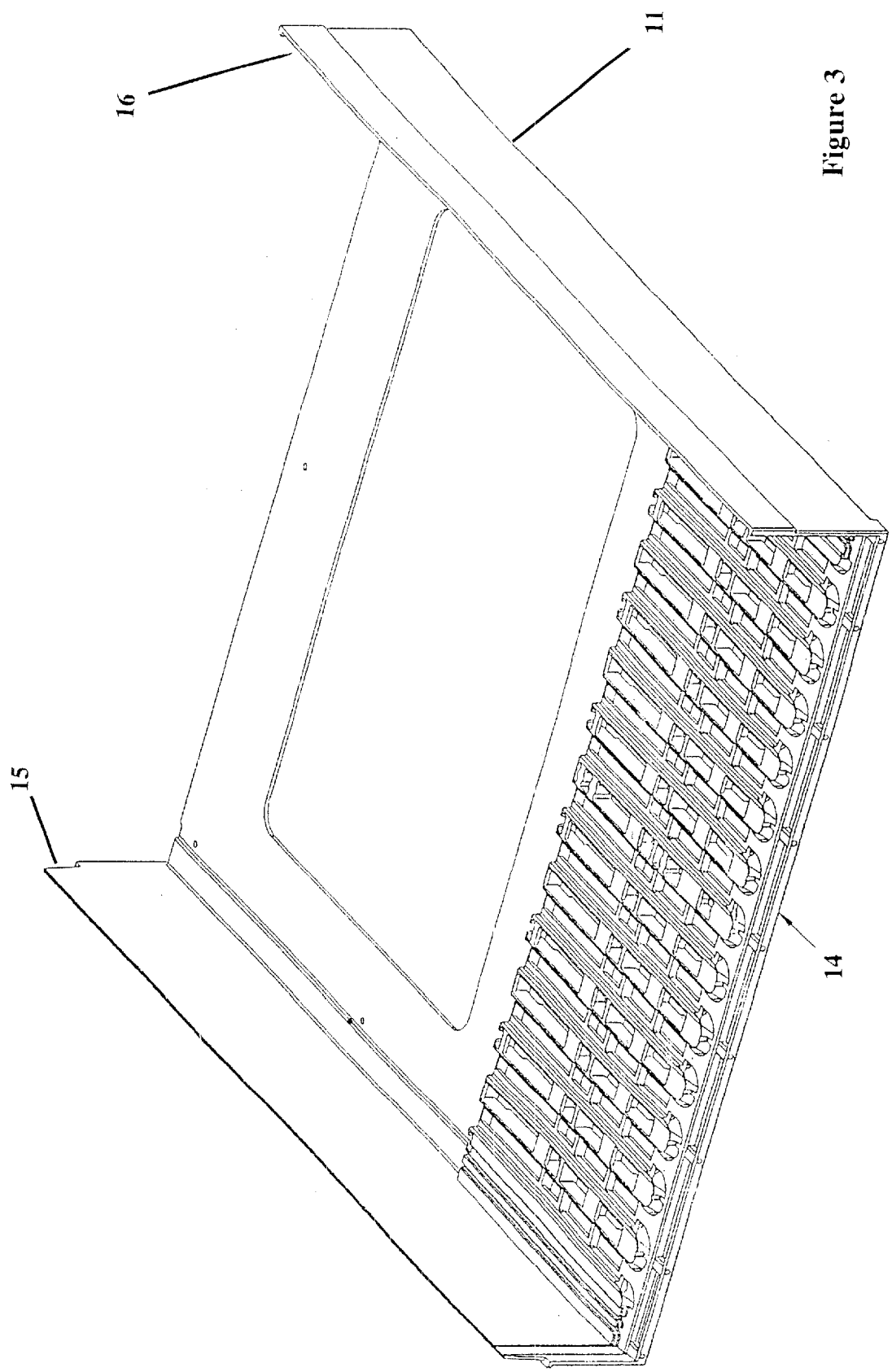
FIG. 3 shows in perspective view one of the halves of the enclosure of FIGS. 1 and 2.

FIG. 3 shows in perspective view one of the halves 11 of the enclosure 22 of FIGS. 1 and 2. Long edges 15, 16 are provided, shaped to interlock smoothly and to permit the halves to be joined.

Figure 4:
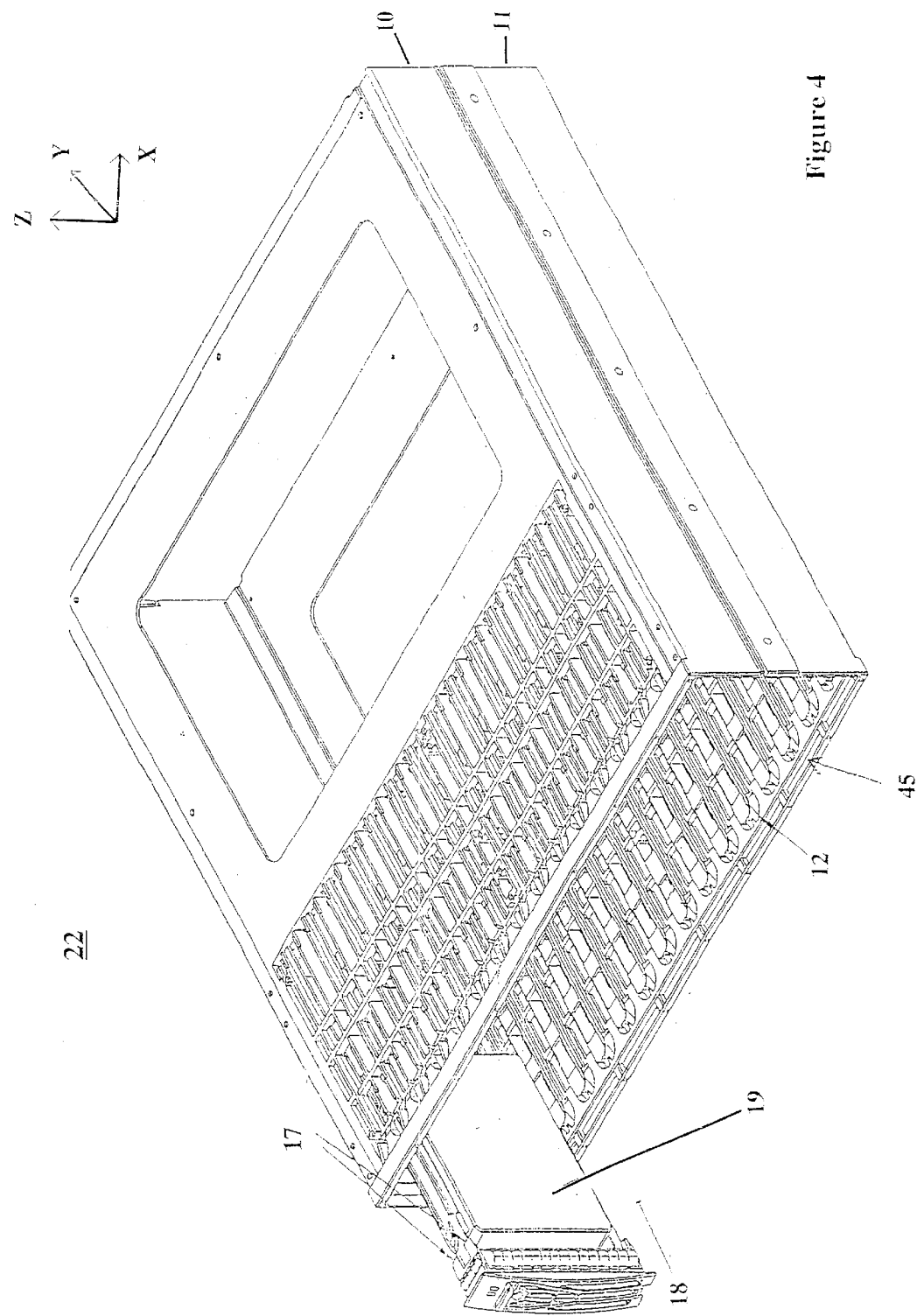
FIG. 4 shows in perspective view the enclosure of FIG. 1 receiving a disk drive carrier.

FIG. 4 shows in perspective view the enclosure 22 of FIG. 1 receiving a disk drive carrier holding a disk drive 19. The drive carrier 19 slides in direction 18, and angled features 17 engage smoothly with rails 12 as the drive carrier 19 slides into place. A cam interlock 45 is also provided. This feature engages with a cam (omitted for clarity in FIG. 4) in a drive carrier 19 which pulls the carrier fully into place when it is being inserted, and which assists in pulling the carrier out when it is being removed.

Figure 5:
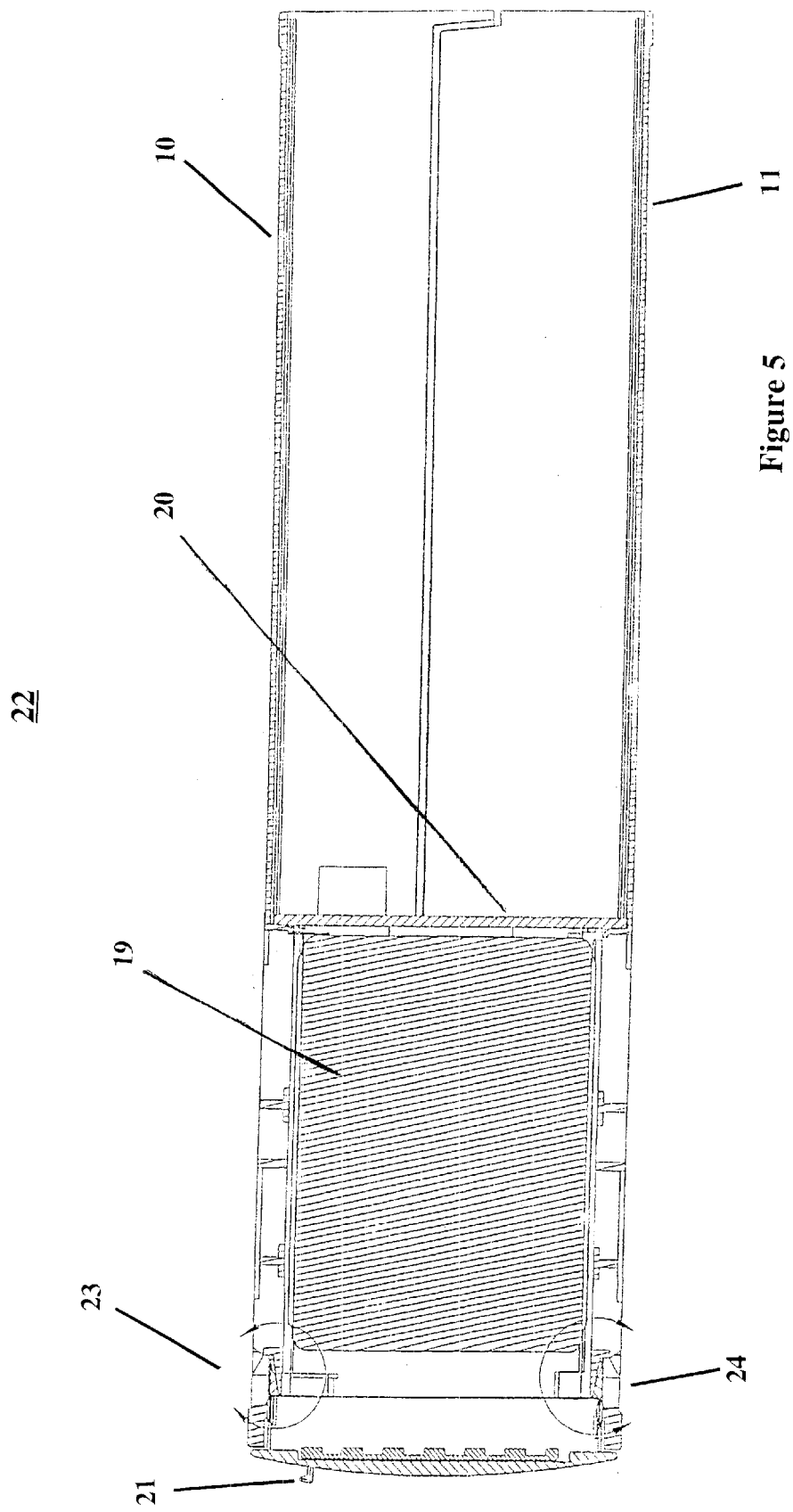
FIG. 5 is a cross section of the enclosure of FIG. 1 showing a disk drive carrier fully inserted.

FIG. 5 is a cross section of the enclosure 22 of FIG. 1 showing a disk drive carrier 19 fully inserted. Top and bottom engagement regions 23 and 24 are shown in more detail in FIGS. 6 and 7, discussed below. The drive carrier 19 engages both electrically and mechanically with a backplane or mother board 20. A latch handle or camming lever 21 is provided, which may be swung outwards to assist in extracting the drive carrier 19 from the enclosure 22, for example in the event that it is necessary to replace the drive carrier 19.

Figure 6:
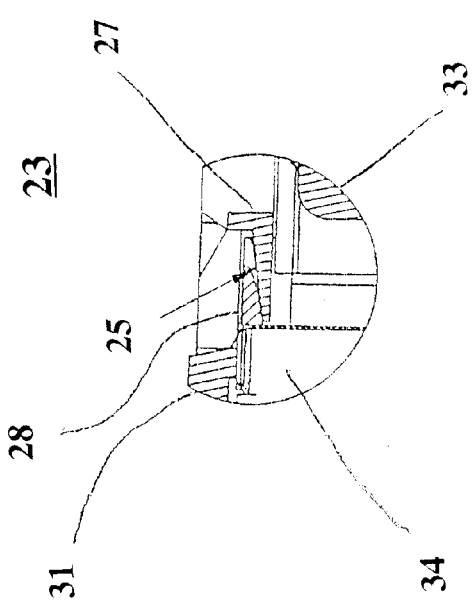
FIGS. 6 and 7 are cross sections showing in closeup the angled areas of wedge engagement at the top and bottom of FIG. 5.
Figure 7:
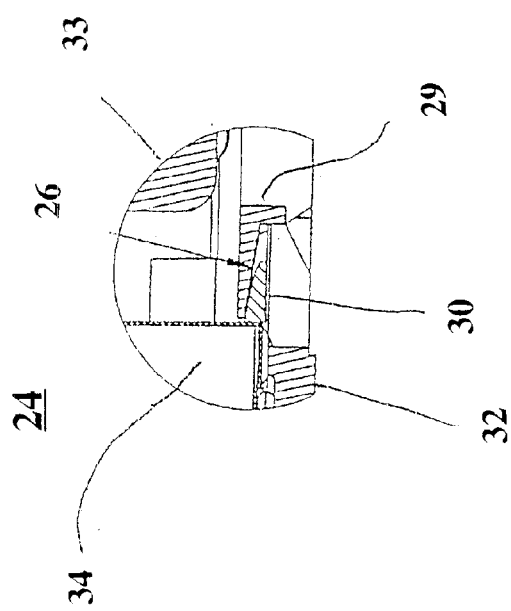

FIGS. 6 and 7 are cross sections showing in closeup the angled rail regions 23, 24 at the top and bottom of FIG. 5. The enclosure 22 includes rail features 27, 29. The disk drive carrier 19 includes mating features 28, 30. These features engage at substantially planar engagement regions 25, 26. The engagement regions 25, 26 are importantly angled relative to the plane defined by the top and bottom faces of the enclosure 22, and are preferably symmetrical, region 25 angled upwards in a mirror image to the region 26 angled downwards. The disk drive carrier 19 further comprises portions 34 and 33.

The wedge features 17 (FIG. 4) extend to one side and to the other side of the disk drive carrier 19, toward respective rails 12 (FIG. 4). Thus, each two disk drive carriers 19 will have a single rail 12 between them. Likewise, each two rails 12 will have a single disk drive carrier 19 between them. The structure of the enclosure 22 defines three axes x, y, and z as shown in FIG. 4. These axes further define three planes xy, yz, and xz. The drive carrier, as mentioned above, is inserted in direction 18 which is in the direction of the y axis. The top and bottom surfaces of the halves 10, 11 are parallel to the xy plane.

The wedge features on the top and bottom of the drive carrier 19 engage into mating recesses on the shelf enclosure 22 when the drive carrier 19 is fully inserted into the enclosure 22. Engaging these features mechanically ties the top and bottom shelf halves 10, 11 together with the drive carrier 19. This improves the overall structure of the enclosure 22, reduces the rotational vibration of the drive carrier 19, and centers the drive carrier 19. The drive carrier 19 has electromagnetic interference (EMI) shields (shown at 50 in FIG. 10) and centering the drive carrier 19 helps to insure proper contact of the EMI shields 50 with the shelf enclosure 22 and with adjacent drive carriers.

It will be appreciated that when a carrier 19 slides all the way into the enclosure 22, the male, wedge shaped T tab carrier features 28, 30 engage fully with female wedge shaped T slots or enclosure features 27, 29. In this way the carrier 19 is interlocked with the enclosure at both the top and the bottom. More particularly, when a carrier 19 is inserted into the enclosure 22, it is first inserted a first distance into the enclosure until the carrier's wedge features are nearby to the enclosure's wedge features, and then it is fully inserted. The full insertion accomplishes several things—the carrier is placed into tension relative to the top and bottom halves of the enclosure, and an electrical connector at the rear of the drive carrier comes into mechanical and electrical connection with a matching electrical connector on the mother board within the enclosure. This full insertion is preferably accomplished with the help of a camming lever pivotably connected to the carrier 19, which camming lever engages with the camming interlock 45 of the enclosure 22. When the time comes to remove the carrier, the camming lever is actuated in the opposite direction, engaging the camming interlock 45 and tending to extract the carrier. In this way the camming lever overcomes sticking friction between the carrier and the enclosure, and provides the extraction force needed to separate the electrical connectors.

The mechanical interfaces between the wedges on the shelf enclosure 22 and drive carrier rails are primarily intended to vertically lock and center the carrier 19 to the enclosure 22. As mentioned earlier, there are wedge features to the left and right sides of the rails 12, which features are intended to "gather" when a carrier 19 is first beginning to be inserted into the enclosure 22. This helps to aim and position the carrier 19 so that it may slide smoothly into place. The side-to-side positioning of the carrier 19 (that is, positioning in the X axis) is essentially controlled by the width of the carrier guide rails relative to the width of the slot between adjacent rails 12.

Figure 8:
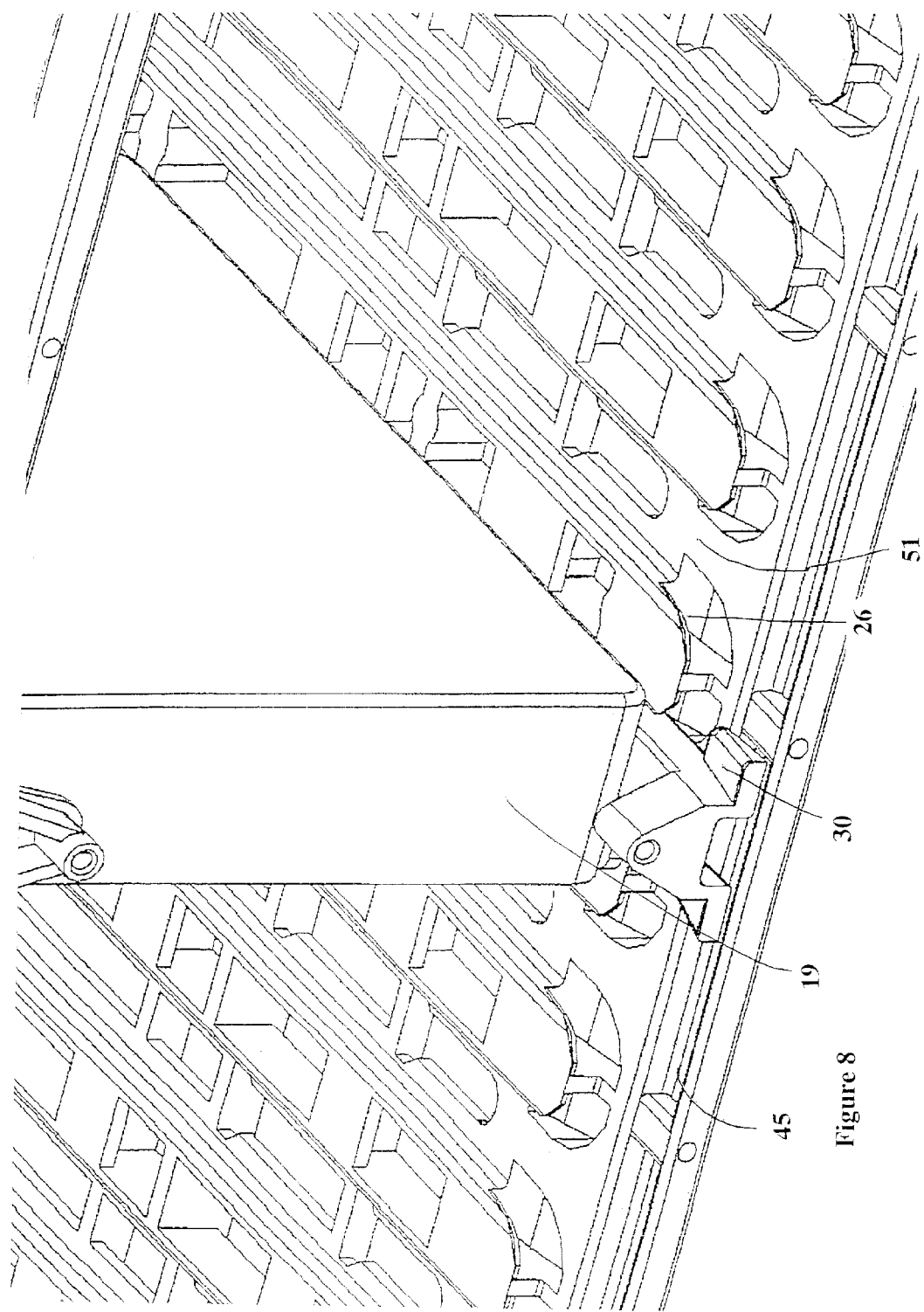
FIG. 8 shows a drive carrier partially inserted into an enclosure.
Figure 9:
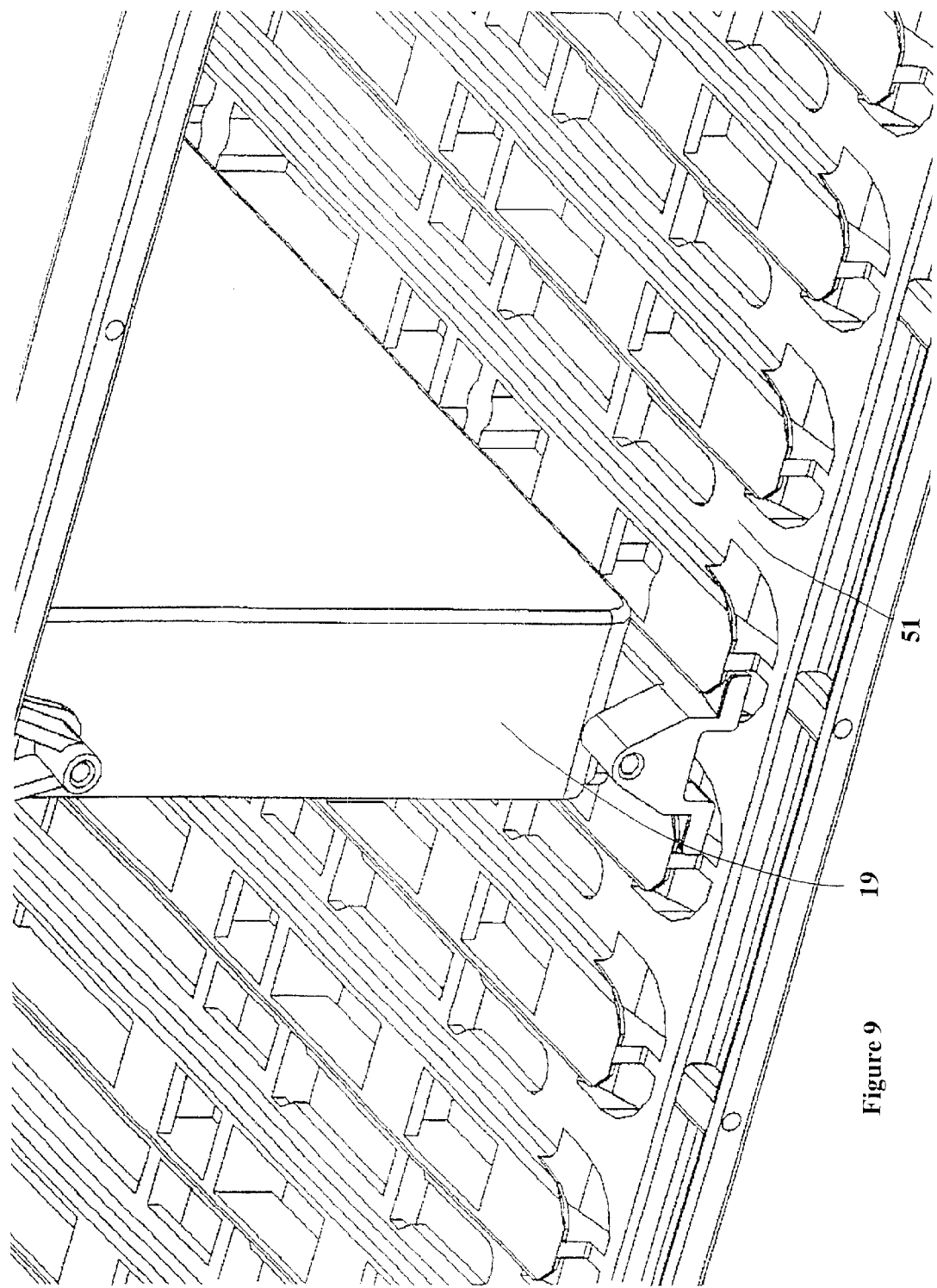
FIG. 9 shows a drive carrier fully inserted into the enclosure.
Figure 10:
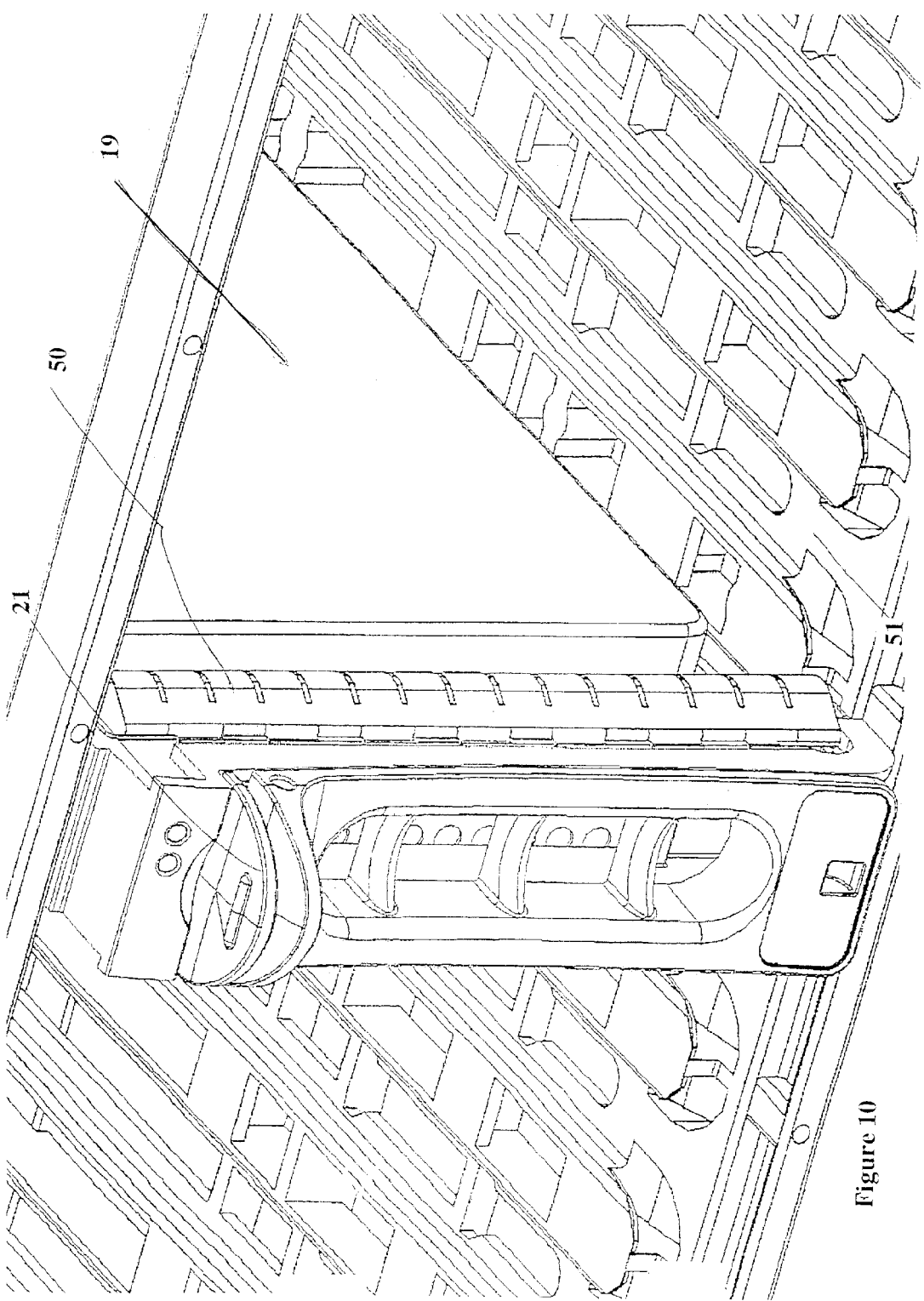
FIG. 10 shows a drive carrier fully inserted into the enclosure, the perspective drawing also showing a bezel and camming lever.

FIG. 8 shows in perspective view a carrier 19 not fully inserted into the enclosure. Wedge surface 30 of the drive carrier may be seen, along with wedge surface 26 of the guide rail. FIG. 9 shows the carrier 19 fully inserted. Guideways 51 may be seen in FIGS. 8 and 9. For clarity in FIGS. 8 and 9, the front bezel and camming lever of the carrier 19 are omitted from the perspective view. FIG. 10 shows the carrier 19 fully inserted, with camming lever 21 visible. RF shield 50 may also be seen along with guideway 51.

The exemplary magnesium casting shelf allows guides for printed circuit boards (PCBs), guides for drive carriers, a backplane mounting flange, an interlock between the drive carrier and the shelf, a drive carrier cam interface 24, and plenum guides. These are all integrally formed with the shelf and provide a structurally strong yet lightweight enclosure. The reduced weight is of commercial importance, because it reduces shipping costs and makes the product more attractive to a customer. The cast metal helps in damping vibration among the disk drives contained within the enclosure. Magnesium as a bulk material offers better thermal conductivity than plastic or steel, which may help with heat dissipation from the disk drives and cooling of the disk drives and power supplies. It offers EMI shielding and has better structural properties.

Those skilled in the art will have no difficulty devising myriad obvious improvements and variations, all of which are intended to fall within the scope of the invention as defined by the claims that follow.

What is claimed is:

1. A data storage system comprising an enclosure, said enclosure having top and bottom walls, each wall having a respective top and bottom face, the bottom face of the top wall and the top face of the bottom wall each having opposed and corresponding rails;

said system further comprising a plurality of drive carriers, each carrier disposed with rails engaging respective enclosure rails, wherein the drive carriers are substantially parallel with each other;

each of said carriers having a top edge and a bottom edge, and further having two wedge features, respective wedge features positioned at the top and bottom edge of the carrier;

each of said rails defining enclosure wedge features, said enclosure wedge features mating with corresponding carrier wedge features;

said wedge features angled such that inserting a carrier fully into the enclosure imposes vertical tension in the carrier and locks the carrier to the enclosure at both the carrier's top edge and bottom edge.

2. The system of claim 1 wherein the enclosure further comprises top and bottom halves, each of said top and bottom halves being identical.

3. The system of claim 2 wherein the halves are made of cast magnesium.

4. The system of claim 3 wherein the magnesium is AZ91D alloy.

5. A method for use with a shelf enclosure, the enclosure comprising rails having wedge features, the method comprising:

sliding a first drive carrier a first distance into corresponding rails in the enclosure until wedge features at top and bottom edges of the first drive carrier draw near to corresponding wedge features of the enclosure;

sliding the first drive carrier a second distance into the rails, whereby the drive carrier wedge features engage the enclosure wedge features, and whereby the first drive carrier is placed in tension, tending to draw opposing faces of the enclosure toward each other.

6. The method of claim 5 further comprising:

sliding a second drive carrier a first distance into corresponding rails in the enclosure until wedge features at top and bottom edges of the second drive carrier draw near to corresponding wedge features of the enclosure;

sliding the second drive carrier a second distance into the rails, whereby the drive carrier wedge features engage the enclosure wedge features, and whereby the second drive carrier is placed in tension, tending to draw the opposing faces of the enclosure toward each other.

* * * * *